(12) United States Patent
Eom et al.

(10) Patent No.: US 11,130,292 B2
(45) Date of Patent: Sep. 28, 2021

(54) ESTIMATING PHYSICAL PROPERTY OF 3D PRINTED PARTS

(71) Applicant: Autodesk, Inc., San Rafael, CA (US)

(72) Inventors: Jaesung Eom, Wexford, PA (US); Ravi Kumar Burla, Novi, MI (US)

(73) Assignee: Autodesk, Inc., San Rafael, CA (US)

( * ) Notice: Subject to any disclaimer, the term of this patent is extended or adjusted under 35 U.S.C. 154(b) by 688 days.

(21) Appl. No.: 15/970,291

(22) Filed: May 3, 2018

(65) Prior Publication Data
US 2018/0319087 A1 Nov. 8, 2018

Related U.S. Application Data

(60) Provisional application No. 62/502,953, filed on May 8, 2017.

(51) Int. Cl.
| | |
|---|---|
| *B29C 64/393* | (2017.01) |
| *G06T 17/30* | (2006.01) |
| *G06T 17/10* | (2006.01) |
| *B29C 64/106* | (2017.01) |
| *G06T 17/00* | (2006.01) |
| *G06F 30/23* | (2020.01) |
| *B33Y 50/02* | (2015.01) |
| *B33Y 10/00* | (2015.01) |

(52) U.S. Cl.
CPC .......... *B29C 64/393* (2017.08); *B29C 64/106* (2017.08); *G06F 30/23* (2020.01); *G06T 17/00* (2013.01); *G06T 17/10* (2013.01); *G06T 17/30* (2013.01); *B33Y 10/00* (2014.12); *B33Y 50/02* (2014.12)

(58) Field of Classification Search
CPC ..... B29C 64/106; B29C 64/393; G06T 17/00; G06T 17/10; G06T 17/30; B33Y 10/00; B33Y 50/02; G06F 30/00; G06F 30/23
USPC .......................................................... 703/1
See application file for complete search history.

(56) References Cited

U.S. PATENT DOCUMENTS

| | | | |
|---|---|---|---|
| 2016/0096318 A1* | 4/2016 | Bickel | G06F 30/20 264/40.1 |
| 2016/0236416 A1* | 8/2016 | Bheda | B33Y 50/02 |
| 2018/0052445 A1* | 2/2018 | Shapiro | G05B 19/4099 |

* cited by examiner

*Primary Examiner* — Cedric Johnson
(74) *Attorney, Agent, or Firm* — Fish & Richardson P.C.

(57) ABSTRACT

Methods, systems, and apparatus, including medium-encoded computer program products, for estimating the physical properties of 3D printed objects that include: obtaining a three dimensional (3D) model of a 3D object to be manufactured by a 3D extrusion printer; obtaining at least a portion of tool path data for the 3D extrusion printer to build the 3D object in accordance with the 3D model; creating unit cell geometry from the at least a portion of tool path data using at least one limitation on one or more unit cells of the unit cell geometry with respect to an aspect of the 3D extrusion printer's build of the 3D object; generating a numerical simulation of one or more microstructural properties of the 3D object to be built using the unit cell geometry; and estimating one or more macroscale properties, of the 3D object to be built, from the numerical simulation.

15 Claims, 5 Drawing Sheets

ESTIMATING PHYSICAL PROPERTY OF 3D PRINTED PARTS

CROSS-REFERENCE TO RELATED APPLICATION

This application claims priority to U.S. Provisional Application No. 62/502,953, filed on May 8, 2017. The disclosure of the prior application is considered part of and is incorporated by reference in the disclosure of this application.

TECHNICAL FIELD

This specification relates to estimating the physical properties of 3D printed objects.

BACKGROUND

Additive manufacturing (AM), also known as solid free form fabrication or three-dimensional (3D) printing, refers to any manufacturing process where 3D objects are built up from raw material (generally powders, liquids, suspensions, or molten solids) in a series of two-dimensional layers or cross-sections. An example of additive manufacturing is Fused Filament Fabrication (FFF). A 3D extrusion printer typically uses FFF to lay down material, such as a plastic filament or metal wire that is unwound from a coil, in layers to produce a 3D printed object.

Traditionally, seasoned engineers make an educated guess about the physical properties of a 3D printed object produced by FFF, based on the properties of the filaments used for FFF and guided by their experience. If a more accurate estimation is needed, a test object is fabricated using a 3D extrusion printer for experimental determination of the physical properties of interest. Additional test objects are fabricated to determine the impact of different 3D printing parameters on the physical properties of the printed object.

Finite element analysis (FEA) is a numerical method for simulating, for example, structural mechanics, heat transfer, fluid flow, mass transport, and electromagnetism. It is typically a two-step process. First, the domain of the problem is divided into a collection of subdomains, with each subdomain represented by a set of element equations to the original problem. Second, all sets of element equations are systematically recombined into a global system of equations for the final calculation. Mesh generation techniques are used for dividing a complex problem into a collection of subdomains. The subdomains generated through mesh generation are called mesh elements. FEA can be used to simulate various physical properties of an object contained within the domain.

Unit cell homogenization is a technique that enables replacement of a complex medium by an 'equivalent' homogeneous medium to solve a global problem. A representative volume element (RVE) is often used for performing unit cell homogenization. A RVE is understood to be a sub-volume of an inhomogeneous medium that is of sufficient size for providing geometrical information necessary for obtaining an appropriate homogenized behavior.

SUMMARY

This specification relates to techniques and methods for estimating the physical properties of 3D printed objects.

In general, one or more aspects of the subject matter described in this specification can be embodied in one or more methods that include: obtaining a three dimensional (3D) model of a 3D object to be manufactured by a 3D extrusion printer; obtaining at least a portion of tool path data for the 3D extrusion printer to build the 3D object in accordance with the 3D model; creating unit cell geometry from the at least a portion of tool path data using at least one limitation on one or more unit cells of the unit cell geometry with respect to an aspect of the 3D extrusion printer's build of the 3D object; generating a numerical simulation of one or more microstructural properties of the 3D object to be built using the unit cell geometry; and estimating one or more macroscale properties, of the 3D object to be built, from the numerical simulation.

In various implementations, creating the unit cell geometry can be based on various criteria. For example, creating the unit cell geometry can include limiting a minimum volume of each unit cell to ensure the unit cell spans at least three layers of the 3D extrusion printer's build of the 3D object, as determined from a layer thickness aspect of the 3D extrusion printer's build of the 3D object. As another example, creating the unit cell geometry can include checking, for each of the one or more unit cells, a percentage of the unit cell falling inside a containing envelope of the 3D extrusion printer's build of the 3D object; and moving any of the one or more unit cells, which have less than fifty percent falling inside the containing envelope, to have a higher percentage of the unit cell within the containing envelope. As another example, creating the unit cell geometry can include limiting a maximum volume of each unit cell to ensure that locality is maintained. The maximum volume of each unit cell, for example, can be a volume of a mesh element containing the unit cell. These and other criteria can be used in various implementations, either alone or in combination with each other.

In various implementations, the one or more macroscale properties can include one or more mechanical properties, one or more thermal properties, one or more electromagnetic properties, or a combination thereof.

Particular embodiments of the subject matter described in this specification can be implemented to realize one or more of the following advantages. Detailed microstructural properties of 3D printed objects can be estimated as early as at the 3D modeling phase. Design cycle of 3D printed objects can be shortened by predicting possible failures of the 3D printed objects during design and modeling phase. Physical properties can be quickly estimated by simulating limited unit cell volumes. The estimation can be robust and applicable to various 3D printing techniques including filling or mixing multiple filament types. The estimated microstructural properties can be extended to macroscale FEA simulation of the entire 3D object. A smooth workflow is provided by automating estimation of microstructural or macroscale physical properties through setting up and running FEA simulations from a selected region in the 3D model of an object. The macroscale properties of a 3D printed object can be determined with reduced computational resource and time. The macroscale properties of a 3D printed object can be automatically checked against a set of requirements for compliance. A toolpath meeting requirements for physical properties when fabricated can be generated using design of experiment or iterative parametric optimization. Multiple physical properties governed by different domains of physics (e.g., thermal and mechanical) can be simultaneously simulated to generate a toolpath, when fabricated, meeting requirements for physical properties of more than one physics domain (e.g., safe strength and favorable thermal conductivity.)

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Typically, a designer of a 3D object for fabrication by a 3D extrusion printer does not accurately know what the macroscale properties of the manufactured 3D printed part will be during the design phase. For example, the macroscale mechanical properties (e.g. elasticity and strength) of a 3D printed object can be highly dependent, among many others, on the printing orientations and sequences of a 3D extrusion printer's fabrication flow. For example, a 3D printed object produced by FFF can have different printing orientation, paths, and infill density, potentially at different layers or portions of the 3D printed object. The combination of different printing orientations, paths, and infill densities lead to different local 'microstructures', with different void distribution and fused filament orientations. These differences in the local microstructures affect the local microstructural properties of a 3D printed object, which in turn affects the object's macroscale properties as a whole. Furthermore, 3D printed objects can have different macroscale properties along different axes, a phenomenon called anisotropy. For example, some mechanical properties of 3D objects printed using FFF can be anisotropic. The mechanical anisotropy of a 3D printed object can be attributed in part to the microstructures and filament-to-filament bond strength. Due to these factors, macroscale properties of a 3D printed object cannot be simply determined from the material properties of the individual filaments that constitute the object.

In fact, some macroscale properties may still be unknown to the designers even after the 3D printed object has been fabricated, as experimental determination of macroscale properties can be complicated, time consuming, expensive, and destructive. However, the designers often desire to know the macroscale properties such as the mechanical, thermal, or electromagnetic properties as these properties may affect the function or behavior of the fabricated object. Therefore, a method and system for estimating the macroscale properties of a 3D printed object from a 3D model is desired.

Figure 1:
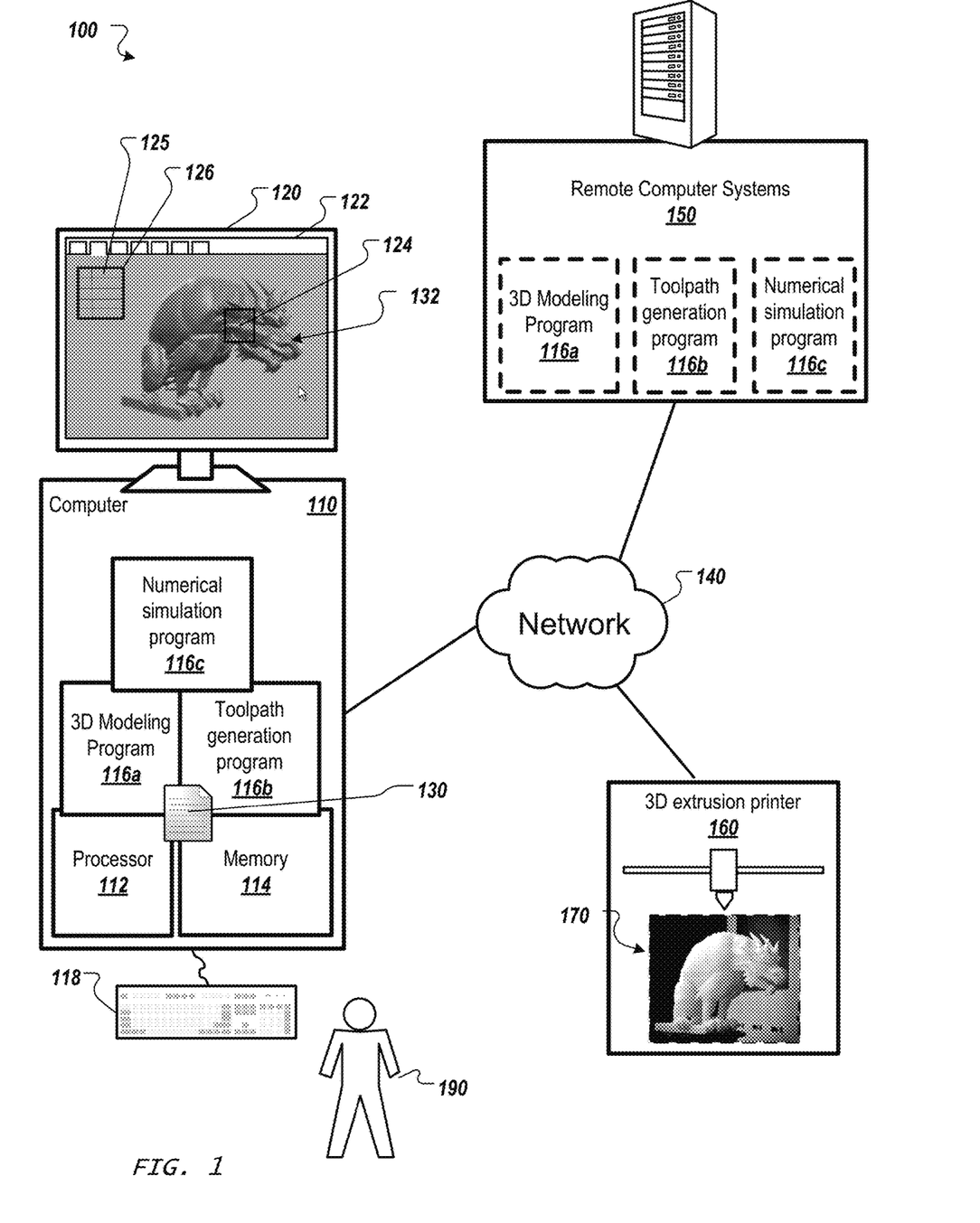
FIG. 1 shows an example of a system to design and estimate the macroscale properties of a 3D printed object.

FIG. 1 shows an example of a system 100 to design and estimate the macroscale properties of a 3D printed object. A computer 110 includes a processor 112 and a memory 114, and the computer 110 can be connected to a network 140, which can be a private network, a public network, a virtual private network, etc. One or more remote computer systems 150 and a 3D extrusion printer 160 can be connected to the computer 110 through the network 140. In some implementations, the 3D extrusion printer 160 is connected directly to the computer 110. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112.

Such programs can include a 3D modeling program 116a, a tool path generation program 116b, and a numerical simulation program 116c, which can each run locally on computer 110, remotely on a computer of one or more remote computer systems 150, or both. The 3D modeling program 116a presents a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer. The tool path generation program 116b and the numerical simulation program 116c can be separate from the 3D modeling program 116a or integrated into the 3D modeling program 116a or into each other. Thus, a "program" as referenced herein can be a procedure within another program.

A user 190 can interact with the 3D modeling program 116a to create a 3D model 132 of a 3D object to be fabricated by the 3D extrusion printer 160. This can be done using known graphical user interface tools. In the example shown, the 3D model 132 is a dragon figurine composed of multiple load bearing regions including the legs and the neck. In general, various suitable forms of 3D model 132 can be created to represent a wide variety of 3D objects that can be manufactured using additive manufacturing systems and techniques. The 3D model 132 can also contain mesh elements for performing FEA simulations.

During the design process, the user 190 can specify a region of interest (ROI) 124 in UI 122 to mark a 3D region for estimating the physical properties of a portion of the 3D model contained within the ROI 124. The size of the ROI 124 can be changed to cover a small portion of the 3D model 132 (e.g., 1 mm$^3$) to probe the microstructural properties of the modeled 3D object at the ROI 124, or cover a large portion of the 3D model 132 (e.g., the entire model) to estimate the macroscale properties of the modeled 3D object.

Estimated values 125 of the physical properties pertaining to the ROI 124 are displayed in a physical properties window 126. In some implementations, the estimated values 125 can be updated at the request of the user 190. In some implementations, the estimated values 125 can be updated automatically based on various user inputs, such as moving or resizing the ROI 124, or modifying the 3D model 132.

The toolpath generation program 116b generates toolpath data 130 based on the 3D model 132. The toolpath data 130 is usable by the 3D extrusion printer 160 to fabricate a 3D printed object 170 corresponding to the 3D model 132. An example of toolpath data is G-code. Commercial and open source examples of the toolpath generation program 116b include Slic3r from Slic3r project (slic3r.org) and Cura from Ultimaker (Geldermalsen, Netherlands).

The inputs of the toolpath generation program 116b include the 3D model 132, printer-hardware parameters, and microstructure-related parameters. The printer-hardware parameters can include nozzle diameter, filament diameter, extrusion temperature, and printer bed temperature. The microstructure-related parameters can include the layer height, number of perimeters, infill pattern, infill ratio, raster angle, raster to raster air gap, and perimeter to raster air gap. As a result, the generated toolpath data 130 contains the information and instructions necessary for the 3D extrusion printer 160 to fabricate the 3D printed object 170. Examples of instructions contained within the toolpath data 130 include printer head movement, stage movement, material feed rate, etc. for each layer. The 3D extrusion printer 160 follows the sets of instructions for each layer until all layers have been deposited to complete the fabrication of the 3D printed object 170.

The numerical simulation program 116c is responsible for simulation of the physical properties of both the microstructures resulting from 3D printing, as well as the 3D model 132 as a whole. The numerical simulation program 116c, for example, can be a FEA simulation program for simulating mechanical, electrical, or thermal properties. Some other examples of the numerical simulation program 116c include a meshless method (element free Galerkin), XFEM (eXtended Finite element Method), BEM (Boundary Element Method), FVM (Finite Volume Method), DGFEM (Discontinuous Galerkin Finite Element Method), IGA (Isogeometric Analysis), and analytical methods based on volume fractions. Examples of mechanical properties to be simulated include elasticity, stiffness, flexibility, shear strength, tensile strength, yield strength, and specific weight. Examples of electrical properties to be simulated include the permittivity, permeability, resistivity, dielectric strength, inductance, and capacitance. Examples of thermal properties to be simulated include thermal conductivity and coefficient of thermal expansion. Commercial examples of the numerical simulation program 116c implementing FEA include NASTRAN from Autodesk Inc. (San Rafael, Calif.) and COMSOL Multiphysics from COMSOL Inc. (Burlington, Mass.).

Figure 2A:
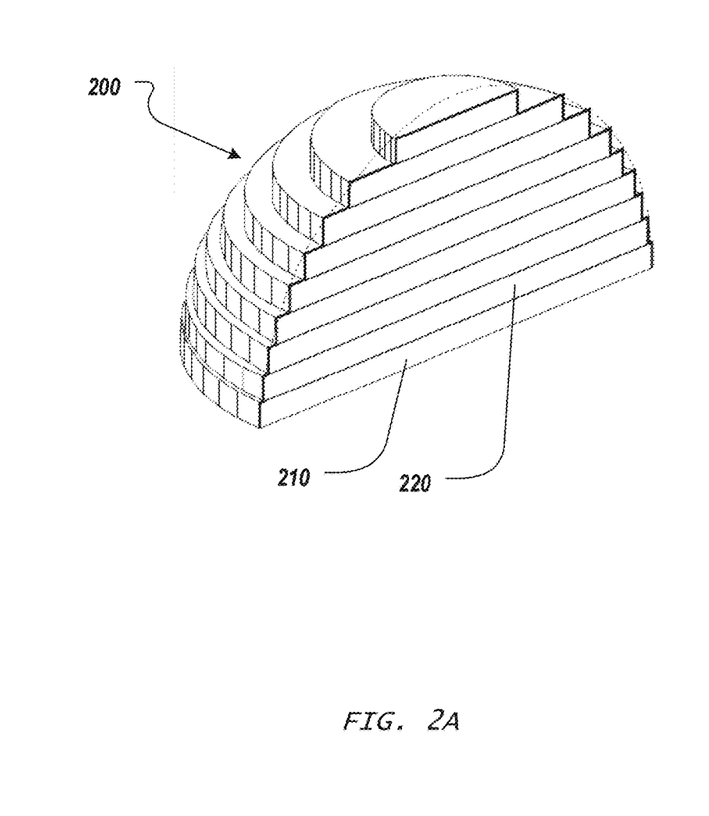
FIGS. 2A and 2B show a schematic diagram of a cross-section of a 3D printed object.
Figure 2B:
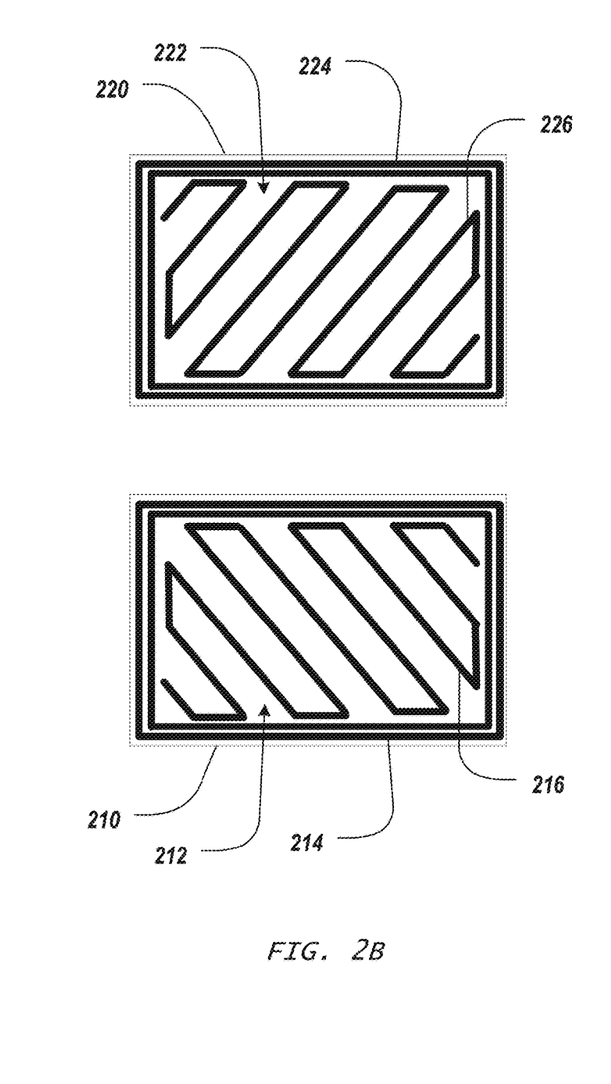

FIGS. 2A and 2B show a schematic diagram of a cross-section of a 3D printed object. A 3D printed object 200 is a stack of individual 3D printed layers, including a first layer 210, and a second layer 220. For example, the 3D printed object 200 shown is a half-sphere, in which individual layers are shaped to form an approximate surface of an ideal sphere. Referring to FIG. 2B, the first layer 210 has a first microstructure 212, and the second layer 220 has a second microstructure 222. The first microstructure 212 is determined by the instructions contained within the toolpath data 130. In some implementations, the first microstructure 212 can include one or more perimeters 214 and an infill pattern 216. For example, the microstructure 212 shown has 2 perimeter filaments, and the infill 216 is a raster pattern with its characteristics raster to raster air gap, perimeter to raster air gap, filament width, and raster angle. More generally, the infill 216 can have various geometries including hexagonal lattices, concentric rectangles, Hilbert curves, and Archimedean chords.

The second microstructure 222 is also determined by the instructions contained within toolpath data 130. In some implementations, the second microstructure 222 can also include one or more perimeters 224 and an infill pattern 226. For example, the microstructure 222 as shown has characteristics that are similar to the microstructure 212, but the infill 226 starts at a different corner than does infill 216, resulting in different filament orientations. In this example, the infills 216 and 226 form a grid-like structure when overlaid, enhancing the structural integrity of the 3D printed object 200. In some cases, the 3D printed object 200 can be formed by alternating between microstructures 212 and 222 for each consecutive layer.

Figure 3:
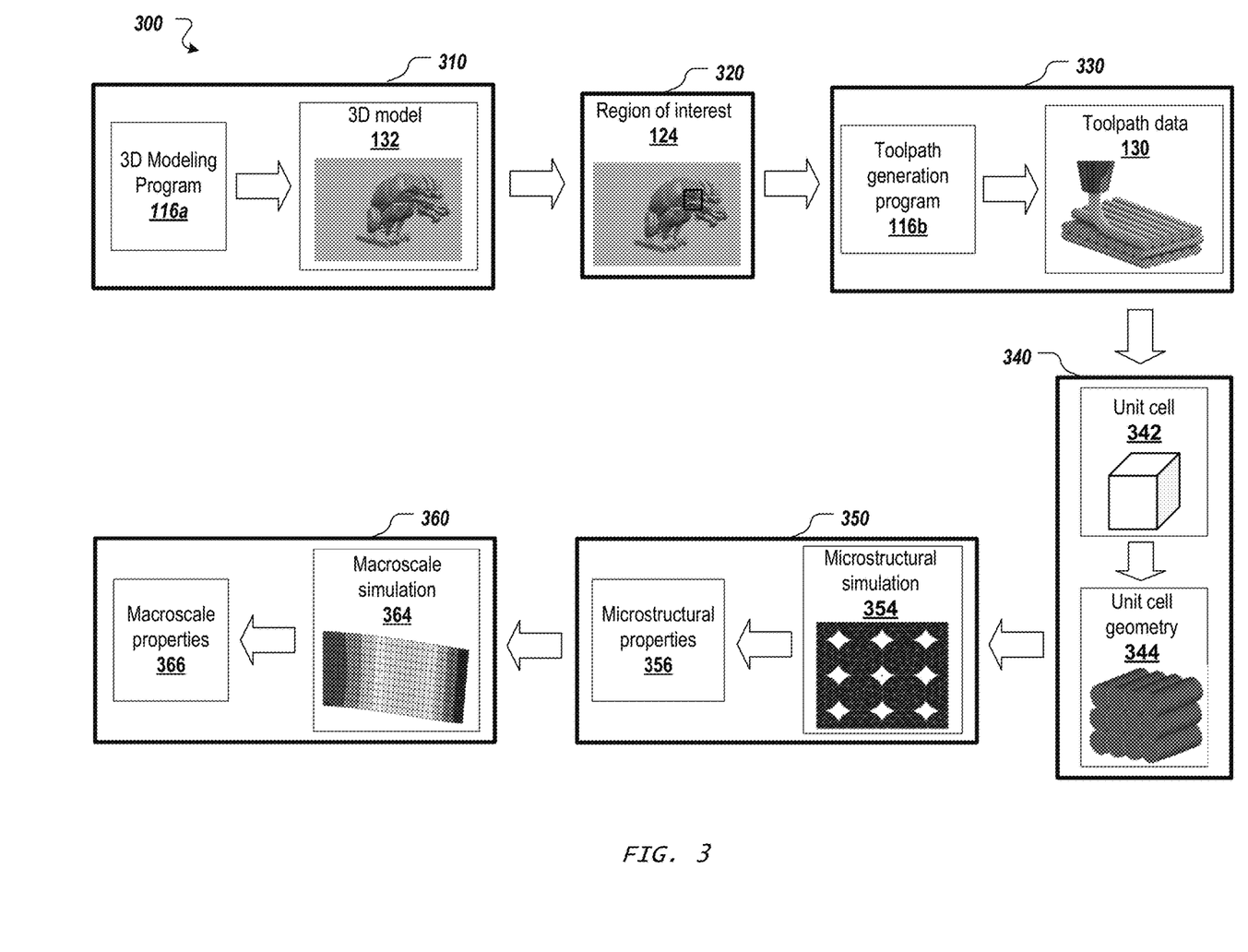
FIG. 3 is a flowchart showing an example of a process to perform macroscale simulation of a 3D model of a 3D printed object using unit cell homogenization.

FIG. 3 is a flowchart showing an example of a process 300 to perform macroscale simulation of a 3D model of a 3D printed object using unit cell homogenization. Initially, at 310, the user 190 uses the 3D modeling program 116a to create the 3D model 132 as described in connection with FIG. 1, or load a previously created 3D model 132.

At 320, during any phase of the modeling process, the user 190 may want to estimate the physical properties of a region of the 3D model 132 by specifying the ROI 124. For example, the specified ROI 124 can be the load bearing neck region of the dragon figurine as shown, and the user 190 may want to estimate the macroscale stiffness of the region. In another example, the specified ROI 124 can be a metamaterial region containing dielectric materials and metallic traces, and the user 190 may want to estimate the macroscale effective permittivity and effective permeability of the region. In another example, the specified ROI 124 can be a critical heat conduction path to estimate the macroscale thermal resistance of the path.

At 330, once the ROI 124 have been specified by the user 190, the toolpath generation program 116b generates the toolpath data 130 containing the instructions for 3D extrusion printer 160. In some implementations, the toolpath data 130 is generated for the entire 3D model 132. In some implementations, the toolpath data 130 is generated locally for the part of the 3D model 132 covered by the ROI 124. In some implementations, the toolpath data is generated hierarchically to avoid re-generation of toolpath data covering the regions that have not been modified since the last generation of the toolpath data. In some implementations, the toolpath data 130 is generated only for the 3D printed layers that overlap with the ROI 124. Such partial generation of toolpath data may be beneficial for improving the speed of the toolpath generation process, and hence improving the speed of the entire process for determining the macroscale properties.

At 340, one or more unit cells 342 are defined for creating one or more unit cell geometries 344, based on the ROI 124 and the toolpath data 130. The unit cell 342 is a 3D region within the ROI 124. The unit cell 342 delineates a portion of the 3D model 132 to be simulated using the numerical simulation program 116c to determine microstructural properties. In some implementations, the unit cell 342 can be defined by the 3D modeling program 116a. The unit cell 342 is used to construct the unit cell geometry 344, which contains the microstructural information necessary for running a numerical simulation to determine the unit cell 342's microstructural properties. The unit cell geometry 344 can be constructed by taking the union of the 3D region occupied by the unit cell 342 and the toolpath data 130. For example, in a conformal method, filament geometries derived from the toolpath data 130 can be implicitly added in the 3D model 132 and converted into to finite element mesh through automatic 3D mesh generation. Another example is a voxel-based method. In the voxel-based method, a voxel domain can be created over the 3D model 132. The voxel domain, for example, can be of a volumetric array of discrete voxels subdividing the 3D model 132. The voxel domain can then be overlaid onto the toolpath data 130. For each voxel, a check can be performed to determine whether a spatial overlap of a voxel with the filaments defined by the toolpath data 130 exceeds a threshold (e.g., more than 1%, 5%, 10%, 20%, 50%, 75%, 99%). If the threshold is exceeded, the entire voxel is considered to be filled with the filament material, and vice versa. The resulting voxel domain consisting of filled and empty voxels can be directly translated to a finite element mesh. For example, each voxel can be translated 1-to-1 to a mesh element.

The unit cell 342 can be defined in various ways. In some examples, the unit cell 342 defined by the 3D modeling program 116a is the ROI 124. In some examples, the unit cell 342 is smaller than the ROI 124. For example, the ROI 124 may contain periodic or quasi-periodic microstructures. In such scenarios, according to the theory of unit cell homogenization, one or more representative volume elements (RVEs) can be determined, which can be used as the unit cells. The resulting unit cells can accurately represent the microstructural properties across the ROI 124 without having to simulate the entire ROI 124. An illustrative example is a brick wall. A brick wall is made of individual bricks glued together by mortar. Because the brick and mortar stacking is repeated quasi-periodically throughout the entire wall, a small subsection of the wall containing just a few bricks glued by a mortar layer can be used as the unit cell, or a RVE, of the entire wall. Therefore, the entire wall made of bricks and mortar can be replaced by a wall of homogeneous material that has the microstructural properties of the unit cell (the 'average' property of a brick wall).

In some examples, the ROI 124 may contain two or more unit cells 342. This may be the case when the portion of the 3D model 132 that falls within the ROI 124 is not sufficiently uniform as informed by the toolpath data 130. For example, the ROI 124 may encompass both the infill region and the perimeter region of a 3D model 132 as determined from the toolpath data 130. A perimeter is typically one or more parallel filaments defining the outer surface of a 3D printed object 170, and this filament configuration of the perimeter is typically substantially different from that of the infill region, where the filaments may be sparse and not parallel to each other. In this case, more than one unit cells should be created and positioned to cover both the perimeter region as well as the infill region to sufficiently describe, or sample, the ROI 124.

In general, when two or more unit cells are needed to adequately sample the ROI 124, several considerations exist for the number, locations, and distribution of the unit cells. One consideration is the mesh density of the 3D model 132. In some implementations, mesh density of the 3D model 132 can be used as a weighing criterion to distribute more unit cells in regions of high mesh density, and less unit cells in regions of low mesh density. Another consideration is the variation of microstructures from layer to layer. In some toolpath data, little variations occur from layer to layer (e.g., uniform hexagonal lattice over multiple layers). Given such toolpath data, more unit cells should be distributed along the plane of the layers to sample variations in microstructure, and less unit cells should be distributed to sample variations, if any, along the out-of-plane direction.

In some implementations, one unit cell can be placed at each of the mesh elements of the 3D model 132. In this case, a unit cell is placed at a representative location of each mesh element as determined using theory of unit cell homogenization. The microstructural properties of the respective unit cells can then be used to homogenize the volume covered by the respective mesh elements. In some examples, the representative location can be the geometrical center of the mesh element.

At 350, the numerical simulation program 116c receives one or more unit cell geometries 344 and generates a microstructural simulation 354, a numerical simulation for generating microstructural properties 356, for each received unit cell geometry. In some implementations, the generation of the microstructural simulation 354 can include recreating the unit cell geometry 344 within the numerical simulation program 116c, assigning of material properties to created geometries, generating mesh, and setting up an appropriate system of equations for the microstructural properties to be simulated.

The numerical simulation program 116c runs the generated microstructural simulation 354 to calculate the microstructural properties 356. In some implementations, quick completion of the microstructural simulation 354 is desired to provide the user 190 with the estimated values 125 of the microstructural properties of the ROI 124 in a quasi-real-time fashion. In such implementations, the number of mesh elements generated by the numerical simulation program 116b can to be reduced to decrease simulation run time. However, it should be noted that a tradeoff exists between the number of mesh elements and the accuracy of a FEA simulation. Therefore, the system 100 may ask user 190 to provide, for example, a desired level of accuracy or a maximum runtime of the microstructural simulation 354 for improved user experience.

At 360, a macroscale simulation 364 encompassing a part of, or the entire 3D model 132 as defined by the ROI 124 is performed using the microstructural properties 356 to determine the macroscale properties 366. Based on the unit cell homogenization technique, the estimated microstructural properties 356 can be used to replace the microstructural details of the 3D model 132 as provided by the toolpath data 130 with one or more homogeneous materials having the estimated microstructural properties 356. If the homogeneous materials are sufficiently representative of the microstructures of the 3D printed object 170 over the ROI 124 simulated in the macroscale simulation 364, the simulated macroscale properties 366 can be a good approximation of the true macroscale properties of the 3D printed object 170 at reduced computational complexity, resource requirement, and time. Examples of macroscale properties that can be simulated are described above in connection with the numerical simulation program 116c and FIG. 1. Additional examples of mechanical macroscale properties that can be simulated using unit cell homogenization simulation include Young's modulus, Poisson's ratio of elasticity, natural frequency, principal strain, principal stress, and measures of stress including Von Mises Stress, Tsai-Wu Failure index, and safe factor. In some implementations, weighted sampling point integration scheme (e.g., Gauss numerical integration, Cubature method) is used to integrate governing equations within a unit cell as part of the macroscale simulation 364.

Figure 4:
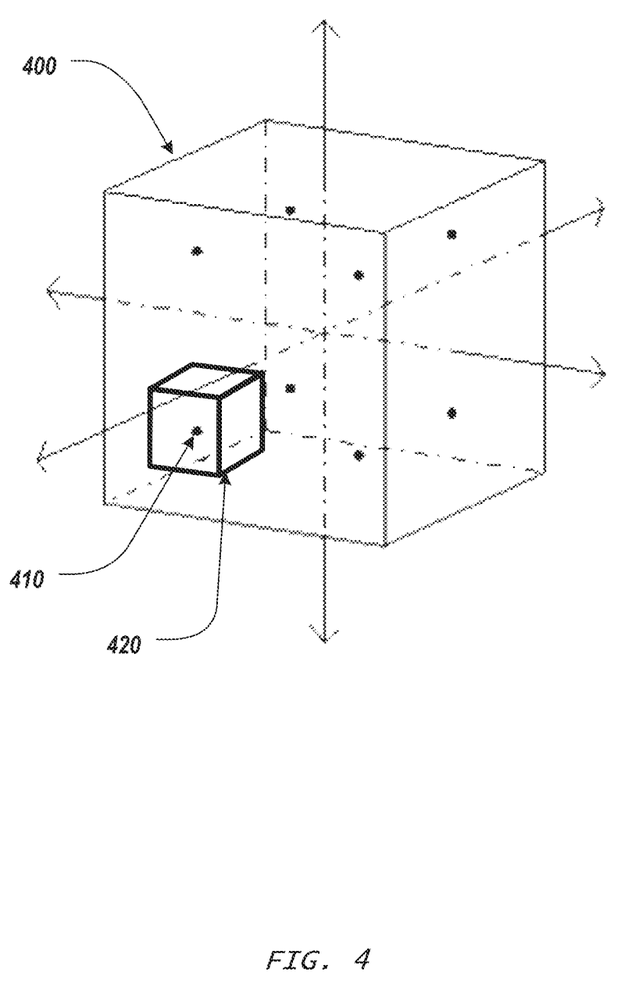
FIG. 4 is a schematic diagram of an example mesh element used in FEA.

FIG. 4 is a schematic diagram of an example mesh element used in FEA. A mesh element 400 includes Gaussian integration points 410 and unit cells 420. In some implementations, the unit cells 420 are each centered on the Gaussian integration points 410. In the example shown, the mesh element 400 is a hexahedron, but other types are possible, including a pyramid, a triangular prism, and a tetrahedron.

Some physical properties, such as the elasticity matrix, may require more than one unit cell geometry to be created and simulated within a mesh element for accurate determination. An approximation of a definite integral of a mathematical function can be stated as a weighted sum of the evaluated function values at the Gaussian integration points 410 within the mesh element 400. The definite integral of a mathematical function is needed for evaluation of certain physical properties, such as elasticity. For example, in evaluating the elasticity, the local stress and strain are evaluated at the Gaussian integration points 410 to provide the most accurate estimation of the elasticity matrix. To evaluate local stress and strain at the Gaussian integration points 410, the microstructural properties of the Gaussian integration points 410 are needed. Therefore, a unit cell can be placed at each of the Gaussian integration points 410 to determine the microstructural properties of the respective Gaussian integration points 410 using the unit cell homogenization technique.

Figure 5:
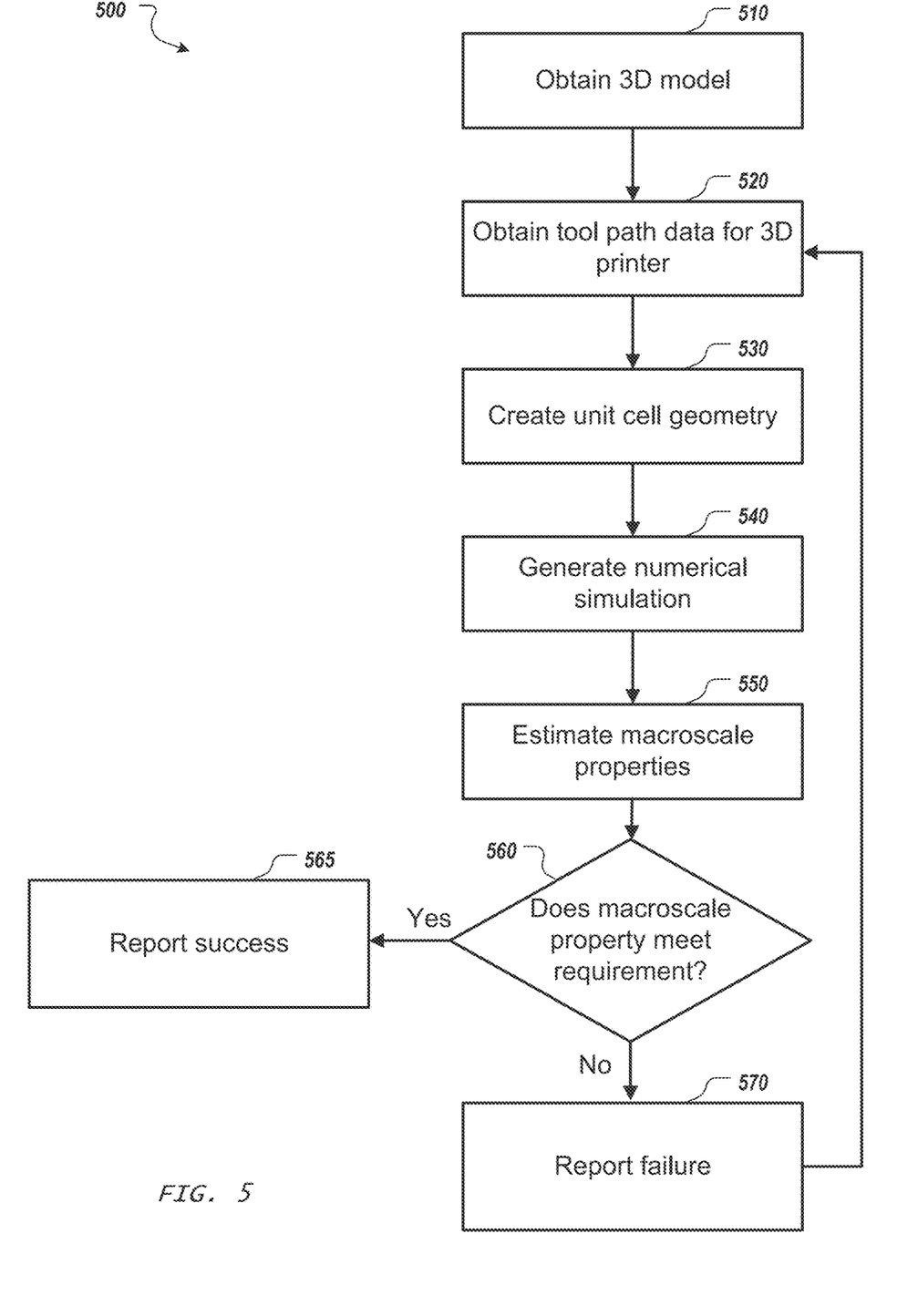
FIG. 5 is a flowchart showing an example of a process to simulate the macroscale properties of a 3D printed object.

FIG. 5 is a flowchart showing an example of a process 500 to simulate the macroscale properties of a 3D printed object. Initially, a 3D model of a 3D object to be manufactured by a 3D extrusion printer is obtained 510. The 3D model 132 of a 3D object can be obtained from the 3D modeling program 116*a* in various ways. For example, the 3D modeling program 116*a* can export the 3D model 132 into a portable digital representation. Examples of the portable digital representation of the 3D model include stereo lithography '.STL' files, wavefront '.OBJ' files, 3D manufacturing format '0.3MF' files, and additive manufacturing file format '.AMF' files. These digital representations can contain information describing the surface geometry of the 3D model 132 and the physical properties of the material constituting the modeled 3D object.

A toolpath data for 3D extrusion printer is then obtained 520. The entire toolpath data or a partial toolpath data can be obtained as described above in connection with FIG. 3 at 330. In some implementations, the generation of the toolpath data 130 can be automated. For example, the 3D modeling program 116*a* can export a suitable output file (e.g., .STL, .OBJ, or .AMF file), which can be passed onto the toolpath generation program 116*b* using an application programming interface of the toolpath generation program 116*b*. Based on the received commands and data files, the toolpath data 130 can be generated without intervention of the user 190.

A unit cell geometry is then created 530. Creating 530 is performed using at least one limitation on one or more unit cells 342 of the unit cell geometry 344 with respect to an aspect of the 3D extrusion printer's build of the 3D object. In some implementations, a unit cell encloses at least three layers of the 3D extrusion printer's build of the 3D object. A unit cell encompassing at least three layers contains both the upper interface and the lower interface of the middle layer as sandwiched by the top and the bottom layer. The inclusion of both interfaces improves the accuracy of the microstructural properties simulated from the unit cell geometry.

In some implementations, the layer height parameter of the 3D extrusion printer, for example, is used to determine the minimum dimensions of a unit cell in corresponding design units (e.g., mm or mil) of the 3D modeling program 116*a*. For example, a typical layer height ranges from 0.2-0.3 mm, leading to a minimum unit cell height of 0.6-0.9 mm. In some implementations, the minimum width and length of the unit cell are equal to the minimum height.

In some implementations, a unit cell has an upper limit in size. For example, the upper limit can come from consideration of locality, a condition used in micromechanics. For the locality condition to hold, the unit cell needs to be smaller than the mesh element that it represents. If the unit cell is larger than the mesh element itself, the unit cell is no longer local to the mesh element and ceases to be representative of the mesh element, violating the locality condition. In some implementations, when multiple Gaussian integration points 410 of the mesh element 400 are used for evaluation of physical properties, the maximum volume of each unit cell is the volume of the mesh element 400 divided by the number of Gaussian integration points of the mesh element to avoid overlapping of unit cells and violation of the locality condition. For example, if an 8-point Gauss integration scheme is used for a macroscale simulation, the unit cell volume should be less than ⅛ of the volume of the macroscale mesh element.

The location of a unit cell can be determined using various criteria. In some implementations, a unit cell is placed so that a substantial fraction of the unit cell is within the containing envelope of the 3D model. For example, if a unit cell is placed near the containing envelope (e.g., a surface) of the 3D model and a large portion of the unit cell falls outside of the 3D model, the unit cell should be moved towards the inside of the 3D model to have more overlap with the 3D model (e.g., more than 1%, 5%, 10%, 20%, 50%, 75%, 99% in volume overlap). In some examples, a unit cell may fall within a sparse region of the 3D model as informed by the toolpath data 130 (e.g., region of low infill) where little or no microstructures exist within the unit cell. In such cases, the unit cell can be moved or enlarged so that the unit cell has greater overlap with the microstructures (e.g., more than 1%, 5%, 10%, 20%, 50%, 75%, 99% in volume overlap).

A numerical simulation is generated 540. The numerical simulation can be generated as described above in connection with FIG. 3 at 350. In some cases, two or more numerical simulations can be run in parallel based on the generated numerical simulation. For example, when calculating linear elasticity, the effective elasticity tensor can be identified from the strain energies of the microstructure under specific boundary conditions. The elasticity tensor can have 6 basic strain modes, which are independent from one another. Therefore, numerical simulations for the 6 basic strain mode can be run in parallel.

Macroscale properties are estimated 550. The macroscale properties can be calculated as described above in connection with FIG. 3 at 360.

A check is performed to determine 560 whether the estimated macroscale properties meet the user's requirements. In some implementations, the user 190 can provide the system 100 with one or more requirements on the microstructural properties or the macroscale properties of the 3D printed object at the ROI 124. Based on estimating 550, if the user requirements are met, success is reported 565 to the user 190. When the user requirements are not met, failure is reported 570, and a retry of the toolpath generation may be initiated by returning to obtaining 520 different toolpath data for 3D extrusion printer generated using different parameters.

In some implementations, the retry of the toolpath generation can be automated. For example, printer-hardware parameters and microstructure-related parameters can be automatically modified during the retry of obtaining 520. In some implementations, the parameters to be changed can be determined automatically by the 3D modeling program 116*a*. The automatic determination can be based on various rules derived from first principles and designer experience to make the automatic iteration more efficient. For example, the program 116*a* may increase the infill density to increase stiffness, or change infill pattern to change the anisotropy as derived from first principles. The process 500 can be repeated until the requirements on the macroscale properties are satisfied.

A computer program (also known as a program, software, software application, script, or code) can be written in any form of programming language, including compiled or interpreted languages, declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., LCD (liquid crystal display), OLED (organic light emitting diode) or other monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method comprising:
   obtaining a three dimensional (3D) model of a 3D object to be manufactured by a 3D extrusion printer;
   obtaining at least a portion of tool path data for the 3D extrusion printer to build the 3D object in accordance with the 3D model;
   creating unit cell geometry from the at least a portion of tool path data using at least one limitation on one or more unit cells of the unit cell geometry with respect to an aspect of the 3D extrusion printer's build of the 3D object, wherein creating the unit cell geometry comprises limiting a minimum volume of each unit cell to ensure the unit cell spans at least three layers of the 3D extrusion printer's build of the 3D object, as determined from a layer thickness aspect of the 3D extrusion printer's build of the 3D object;
generating a numerical simulation of one or more microstructural properties of the 3D object to be built using the unit cell geometry; and
estimating one or more macroscale properties, of the 3D object to be built, from the numerical simulation.

2. The method of claim 1, wherein creating the unit cell geometry comprises:
checking, for each of the one or more unit cells, a percentage of the unit cell falling inside a containing envelope of the 3D extrusion printer's build of the 3D object; and
moving any of the one or more unit cells, which have less than fifty percent falling inside the containing envelope, to have a higher percentage of the unit cell within the containing envelope.

3. The method of claim 1, wherein creating the unit cell geometry comprises limiting a maximum volume of each unit cell to ensure that locality is maintained.

4. The method of claim 3, wherein the maximum volume of each unit cell is a volume of a mesh element containing the unit cell.

5. The method of claim 1, wherein the one or more macroscale properties comprise one or more mechanical properties, one or more thermal properties, one or more electromagnetic properties, or a combination thereof.

6. A non-transitory computer-readable medium encoding a computer program operable to cause data processing apparatus to perform operations comprising:
obtaining a three dimensional (3D) model of a 3D object to be manufactured by a 3D extrusion printer;
obtaining at least a portion of tool path data for the 3D extrusion printer to build the 3D object in accordance with the 3D model;
creating unit cell geometry from the at least a portion of tool path data using at least one limitation on one or more unit cells of the unit cell geometry with respect to an aspect of the 3D extrusion printer's build of the 3D object, wherein creating the unit cell geometry comprises limiting a minimum volume of each unit cell to ensure the unit cell spans at least three layers of the 3D extrusion printer's build of the 3D object, as determined from a layer thickness aspect of the 3D extrusion printer's build of the 3D object;
generating a numerical simulation of one or more microstructural properties of the 3D object to be built using the unit cell geometry; and
estimating one or more macroscale properties, of the 3D object to be built, from the numerical simulation.

7. The non-transitory computer-readable medium of claim 6, wherein creating the unit cell geometry comprises:
checking, for each of the one or more unit cells, a percentage of the unit cell falling inside a containing envelope of the 3D extrusion printer's build of the 3D object; and
moving any of the one or more unit cells, which have less than fifty percent falling inside the containing envelope, to have a higher percentage of the unit cell within the containing envelope.

8. The non-transitory computer-readable medium of claim 6, wherein creating the unit cell geometry comprises limiting a maximum volume of each unit cell to ensure that locality is maintained.

9. The non-transitory computer-readable medium of claim 8, wherein the maximum volume of each unit cell is a volume of a mesh element containing the unit cell.

10. The non-transitory computer-readable medium of claim 6, wherein the one or more macroscale properties comprise one or more mechanical properties, one or more thermal properties, one or more electromagnetic properties, or a combination thereof.

11. A system comprising:
a user interface device; and
one or more computers operable to interact with the user interface device and to
obtain a three dimensional (3D) model of a 3D object to be manufactured by a 3D extrusion printer,
obtain at least a portion of tool path data for the 3D extrusion printer to build the 3D object in accordance with the 3D model,
create unit cell geometry from the at least a portion of tool path data using at least one limitation on one or more unit cells of the unit cell geometry with respect to an aspect of the 3D extrusion printer's build of the 3D object, wherein the one or more computers are programmed to create the unit cell geometry and limit a minimum volume of each unit cell to ensure the unit cell spans at least three layers of the 3D extrusion printer's build of the 3D object, as determined from a layer thickness aspect of the 3D extrusion printer's build of the 3D object,
generate a numerical simulation of one or more microstructural properties of the 3D object to be built using the unit cell geometry, and
estimate one or more macroscale properties, of the 3D object to be built, from the numerical simulation.

12. The system of claim 11, wherein the one or more computers are programmed to:
check, for each of the one or more unit cells, a percentage of the unit cell falling inside a containing envelope of the 3D extrusion printer's build of the 3D object; and
move any of the one or more unit cells, which have less than fifty percent falling inside the containing envelope, to have a higher percentage of the unit cell within the containing envelope.

13. The system of claim 11, wherein the one or more computers are programmed to create the unit cell geometry and limit a maximum volume of each unit cell to ensure that locality is maintained.

14. The system of claim 13, wherein the maximum volume of each unit cell is a volume of a mesh element containing the unit cell.

15. The system of claim 11, wherein the one or more macroscale properties comprise one or more mechanical properties, one or more thermal properties, one or more electromagnetic properties, or a combination thereof.

* * * * *